(12) United States Patent
Cheng et al.

(10) Patent No.: US 9,431,265 B2
(45) Date of Patent: Aug. 30, 2016

(54) FIN CUT FOR TIGHT FIN PITCH BY TWO DIFFERENT SIT HARD MASK MATERIALS ON FIN

(71) Applicant: International Business Machines Corporation, Armonk, NY (US)

(72) Inventors: Kangguo Cheng, Schenectady, NY (US); Ali Khakifirooz, Los Altos, CA (US); Alexander Reznicek, Troy, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/499,595

(22) Filed: Sep. 29, 2014

(65) Prior Publication Data

US 2016/0093502 A1 Mar. 31, 2016

(51) Int. Cl.
*H01L 21/308* (2006.01)
*H01L 29/06* (2006.01)

(52) U.S. Cl.
CPC ........ *H01L 21/3086* (2013.01); *H01L 21/3081* (2013.01); *H01L 29/0657* (2013.01)

(58) Field of Classification Search
CPC ........... H01L 29/66795; H01L 29/785; H01L 29/165; H01L 21/823431; H01L 27/0886; H01L 21/3086; H01L 21/0337; H01L 21/31144; H01L 21/32139
See application file for complete search history.

(56) References Cited

U.S. PATENT DOCUMENTS

| | | | |
|---|---|---|---|
| 8,664,102 B2 | 3/2014 | O'Meara et al. | |
| 8,673,725 B2 | 3/2014 | O'Meara et al. | |
| 8,703,616 B2 | 4/2014 | Wells | |
| 8,735,296 B2 | 5/2014 | Jung et al. | |
| 2007/0065990 A1 | 3/2007 | Degroote et al. | |
| 2011/0021027 A1 | 1/2011 | Johnson | |
| 2012/0280354 A1 | 11/2012 | Moroz et al. | |
| 2015/0318181 A1* | 11/2015 | Cantone | H01L 29/66795 438/702 |

* cited by examiner

*Primary Examiner* — Tony Tran
(74) *Attorney, Agent, or Firm* — Scully, Scott, Murphy & Presser, P.C.; Daniel P. Morris, Esq.

(57) ABSTRACT

Methods that enable fin cut at very tight pitch are provided. After forming a first set of paired sidewall image transfer (SIT) spacers and a second set of paired SIT spacers composed of different materials, portions of the first set of the paired SIT spacers can be selectively removed without adversely affecting the second set of the paired SIT spacers, even portions of both sets of the paired SIT spacers are exposed by the cut mask due to the different etching characteristics of the different materials.

15 Claims, 12 Drawing Sheets

US 9,431,265 B2

FIN CUT FOR TIGHT FIN PITCH BY TWO DIFFERENT SIT HARD MASK MATERIALS ON FIN

BACKGROUND

The present application relates to semiconductor device fabrication. More particularly, the present application relates to semiconductor fin formation by using two sets of spacers having different etching characteristics in a sidewall image transfer (SIT) process.

As integrated circuits continue to scale downward in size, fin field effect transistors (FinFETs) are becoming increasingly attractive to be used in smaller nodes, e.g., the 22 nm node and beyond. FinFETs can achieve higher drive currents with increasingly smaller dimensions as compared to conventional planar FETs. In order to meet the density targets of advanced nodes, semiconductor fins are typically formed utilizing a sidewall image transfer (SIT) process since the same provides sub-lithographic line widths (i.e., less than 40 nm). In a typical SIT process, spacers are formed on each sidewall of a mandrel structure that is formed on a topmost semiconductor material of a substrate. The mandrel structure is removed and the remaining spacers are used as an etch mask to etch the topmost semiconductor material of the substrate. The spacers are then removed after each semiconductor fin has been formed.

One problem that is associated with forming semiconductor fins at tight pitch is that the process window for cutting of unwanted semiconductor fins is quite narrow. More specifically, the space available between fins at a tight pitch decreases the process window for placement of a fin cut mask edge in between fins. As the pitch of the semiconductor fins decreases, it becomes difficult to remove unwanted semiconductor fins without adversely affecting adjacent device fins due to the process variation and small process margin of lithographic processes. As such, a method is needed that is capable of forming semiconductor fins in which the process window for cutting unwanted semiconductor fins is improved.

SUMMARY

The present application provides methods that enable fin cut at very tight pitch. After forming a first set of paired SIT spacers and a second set of paired SIT spacers composed of different materials, portions of the first set of the paired SIT spacers can be selectively removed without adversely affecting the second set of the paired SIT spacers, even portions of both sets of the paired SIT spacers are exposed by the cut mask due to the different etching characteristics of the different materials.

In one aspect of the present application, a method of forming a semiconductor structure is provided. The method includes first forming a plurality of mandrel structures on a substrate, and then forming first spacers on sidewalls of the plurality of mandrel structures. Next, sacrificial spacers are formed on sidewalls of the first spacers. After forming second spacers on sidewalls of the sacrificial spacers, the plurality of mandrel structures and the sacrificial spacers are removed selective to the first spacers and the second spacers. Next, a cut mask including at least one opening therein is formed over the first spacers, the second spacers and exposed surfaces of the substrate. The at least one opening in the cut mask exposes portions of the first spacers and portions of the second spacers. Next, exposed portions of the first spacers are removed selective to exposed portions of the second spacers.

In another aspect of the present application, a semiconductor structure is provided. The semiconductor structure includes a plurality of semiconductor fins located on a substrate and arranged in pairs. Each pair of the plurality of semiconductor fins has a first pitch. Adjacent semiconductor fins in the plurality of semiconductor fins have a pitch the same as or 3n times the first pitch, and n is an integer greater than 0.

DETAILED DESCRIPTION

Figure 1:
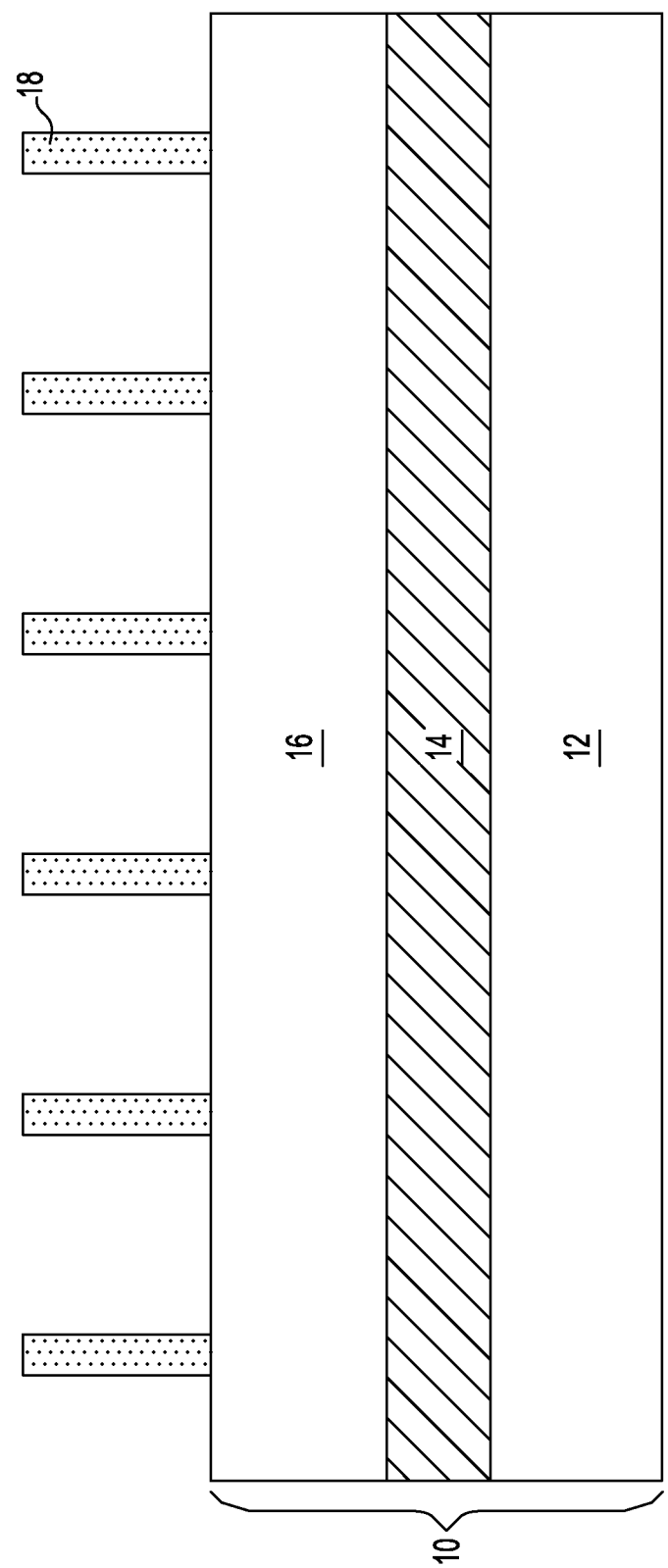
FIG. 1 is a cross-sectional view of an exemplary semiconductor structure including a plurality of mandrel structures located on a surface of a substrate in accordance with an embodiment of the present application.

The present application will now be described in greater detail by referring to the following discussion and drawings that accompany the present disclosure. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Although the following description and drawings of the present application disclose utilizing the methods of the present application for forming semiconductor fins, the present application is not limited to only the formation of semiconductor Fins. Instead, the present application can be used in forming other types of structures.

Referring first to FIG. 1, there is illustrated an exemplary semiconductor structure comprising a plurality of mandrel structures 18 located on a surface of a substrate 10 in accordance with an embodiment of the present application.

In one embodiment of the present application and as illustrated in the drawings of the present application, the substrate 10 is a semiconductor-on-insulator (SOI) substrate that includes, from bottom to top, a handle substrate 12, an insulator layer 14 and a top semiconductor layer 16. In some embodiments, the handle substrate 12 is optional and can be omitted. In another embodiment of the present application, the substrate 10 can be comprised of a bulk semiconductor substrate. By "bulk semiconductor substrate" it is meant a semiconductor material that is comprised entirely of a semiconductor material. For example, the substrate 10 shown in FIG. 1 would consist entirely of the top semiconductor layer 16.

When present, the handle substrate 12 can include a semiconductor material, a conductive material, and/or a dielectric material. The handle substrate 12 can provide mechanical support to the insulator layer 14, and the top semiconductor layer 16 of an SOI substrate. The thickness of the handle substrate 12 can be from 30 microns to 2 mm, although lesser and greater thicknesses can also be employed.

When present, the insulator layer 14 may be a crystalline, or non-crystalline, oxide or nitride. In one embodiment, the insulator layer 14 is an oxide such as, for example, silicon oxide. The insulator layer 14 may be a single continuous layer that spans the entirety of the handle substrate 12 or it may be discontinuous. When a discontinuous insulator region is present, the insulator region exists as an isolated island that is surrounded by semiconductor material. The thickness of the insulator layer 14 can be from 50 nm to 5 microns, although lesser and greater thicknesses can also be employed.

The top semiconductor layer 16 (or the bulk semiconductor substrate) can include a single crystalline semiconductor material or a polycrystalline material. In one embodiment, the top semiconductor layer 16 (or the bulk semiconductor substrate) can include an elemental semiconductor material such as Si or Ge, a semiconductor material primarily composed of Group IV elements such as a silicon-germanium alloy or a silicon-carbon alloy, a III-V compound semiconductor material, a II-VI compound semiconductor material, or an organic semiconductor material. In one embodiment, the top semiconductor layer 16 (or the bulk semiconductor substrate) can include a single crystalline elemental semiconductor material, a single crystalline semiconductor material primarily composed of Group IV elements, a single crystalline III-V compound semiconductor material, a single crystalline II-VI compound semiconductor material, or a single crystalline organic semiconductor material. In another embodiment, the top semiconductor layer 16 (or the bulk semiconductor substrate) can consist essentially of undoped single crystalline silicon or single crystalline silicon doped with p-type dopant atoms or n-type dopant atoms.

The mandrel structures 18 can include any material (semiconductor, dielectric or conductive) that can be selectively removed from the structure during a subsequently performed etching process. In one embodiment, the mandrel structures 18 may be composed of amorphous silicon, polysilicon, amorphous or polycrystalline germanium, an amorphous or polycrystalline silicon-germanium alloy material, amorphous carbon, diamond-like carbon, or organosilicate glass. In another embodiment, the mandrel structures 18 may be composed of a metal such as, for example, Al, W, or Cu.

The mandrel structures 18 can be formed by first depositing a blanket layer of a mandrel material on the entire topmost surface of substrate 10 (not shown). The mandrel material layer can be formed, for example, by chemical vapor deposition (CVD) or plasma enhanced chemical vapor deposition (PECVD). The thickness of the mandrel material layer can be from 50 nm to 300 nm, although lesser and greater thicknesses can also be employed. Following deposition of the mandrel material layer, the mandrel material layer can be patterned by lithography and etching. The patterning of the mandrel material layer can be performed, for example, by applying a photoresist layer (not shown) above the mandrel material layer, lithographically patterning the photoresist layer to define a set of areas covered by the patterned photoresist layer, and transferring the pattern in the photoresist layer into the mandrel material layer by an anisotropic etch. The anisotropic etch can be selective to the semiconductor materials of the top semiconductor layer 16 of the substrate 10. The patterned portions of the mandrel material layer constitute the plurality of mandrel structures 18.

Each mandrel structure 18 that is formed may have a rectangular shape in cross-section with a constant width. In one embodiment, the width of each mandrel structure 18 is from 10 nm to 50 nm, although lesser and greater widths can also be employed. The height of each mandrel structure 18 that is formed is from 50 nm to 300 nm, although lesser and greater height can also be employed. In the embodiment that is illustrated in FIG. 1, the mandrel structures 18 are arranged parallel to each other to form an array of periodic patterns that is repeated along a direction perpendicular to an elongated direction (i.e., lengthwise direction) of each mandrel structure 18. In one embodiment, the mandrel structures 18 can have a pitch from 50 nm to 200 nm, although lesser and greater pitch can also be employed. Though the mandrel structures 18 as shown in FIG. 1 have a constant pitch, in some embodiments of the present application, the mandrel structures 18 may have a non-constant pitch.

Optionally, a pad layer which may be comprised of silicon nitride or a bilayer comprised of a silicon nitride layer and an underlying silicon dioxide layer can be deposited on the top semiconductor layer 16 before the deposition of the mandrel layer. The pad layer, when present, protects the top semiconductor layer 16 during the subsequent patterning processes.

Figure 2:
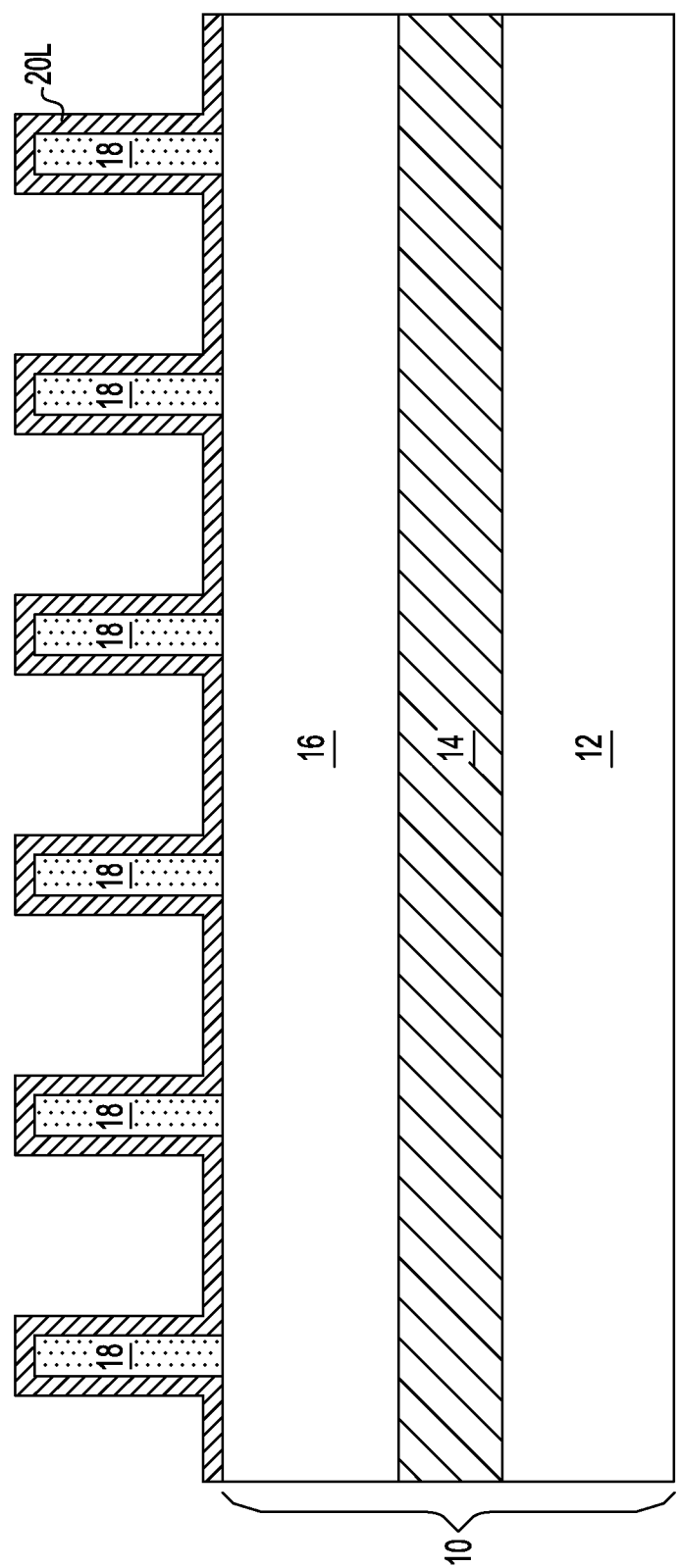
FIG. 2 is a cross-sectional view of the exemplary semiconductor structure of FIG. 1 after forming a first spacer material layer over the mandrel structures and exposed surfaces of the substrate.

Referring now to FIG. 2, there is illustrated the exemplary semiconductor structure of FIG. 2 after forming a first spacer material layer 20L. The first spacer material layer 20L may be conformally deposited over mandrel structures 18 and exposed surfaces of substrate 10 by a conformal deposition process, such as, for example, CVD. The thickness of the first spacer material layer 20L may vary depending upon the desired width of final semiconductor fins structures to be formed in the top semiconductor layer 16 of structure 10, and can be from 5 nm to 15 nm, although lesser and greater thicknesses can also be employed.

The first spacer material layer 20L may include any dielectric material that has a different etching characteristics comparing to the material of the mandrel structures 18 in embodiments in which the mandrel structures 18 comprise a dielectric material, so that the mandrel structures 18 can be selectively removed with respect to the first spacer subsequently formed.

In one embodiment of the present application, the first spacer material layer 20L may include a nitride such as silicon nitride or an oxide such as silicon dioxide.

In another embodiment of the present application, the dielectric material that is used in providing the first spacer material layer 20L may be a dielectric material having a dielectric constant of less than silicon dioxide (such dielectric materials may be referred to herein as low k). Examples of dielectric materials having a low dielectric constant include, but are not limited to, silsesquioxanes, C-doped oxides (i.e., organic silicates) that include atoms of Si, C, O and H, and thermosetting polyarylene ethers. The term "polyarylene" is used throughout the present application to denote aryl moieties or inertly substituted aryl moieties which are linked together by bonds, fused rings, or inert linking groups such as, for example, oxygen, sulfur, sulfone, sulfoxide, carbonyl and the like.

In yet another embodiment of the present application, the dielectric material that is used in providing the first spacer material layer 20L may be a dielectric material having a dielectric constant that is equal to or even greater than that of silicon dioxide (such dielectric materials may be referred to herein as high k). Examples of high k dielectric materials include, for example, a dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

Figure 3:
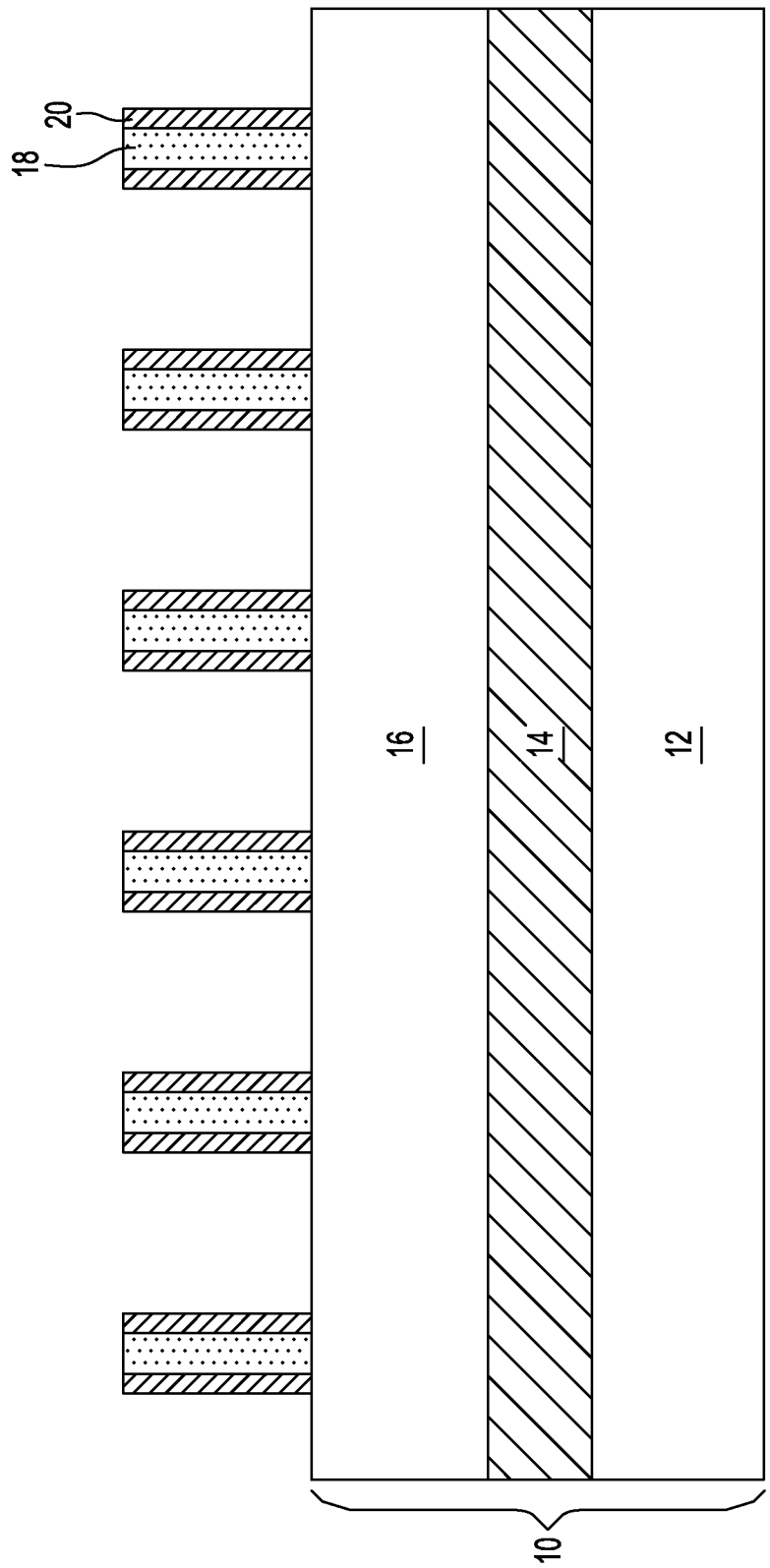
FIG. 3 is a cross-sectional view of the exemplary semiconductor structure of FIG. 2 after forming a first spacer on each sidewall of the mandrel structures.

Referring now to FIG. 3, there is illustrated the exemplary semiconductor structure of FIG. 2 after removing horizontal portions of the first spacer material layer 20L to provide first spacers 20. Each first spacer 20 comprises a remaining portion of the first spacer material layer 20L on each sidewall of the mandrel structures 18. The removal of the horizontal portions of the first spacer material layer 20L can be achieved utilizing an anisotropic etch, such as, for example, reactive ion etch (RIE).

After removal of the horizontal portions of the first spacer material layer 20L, a topmost surface of each mandrel structure 18 is exposed and is coplanar with a topmost surface of each first spacer 20. A width of each first spacer, as measured at its base, can be from 5 nm to 10 nm, although lesser and greater thicknesses can also be employed.

Figure 4:
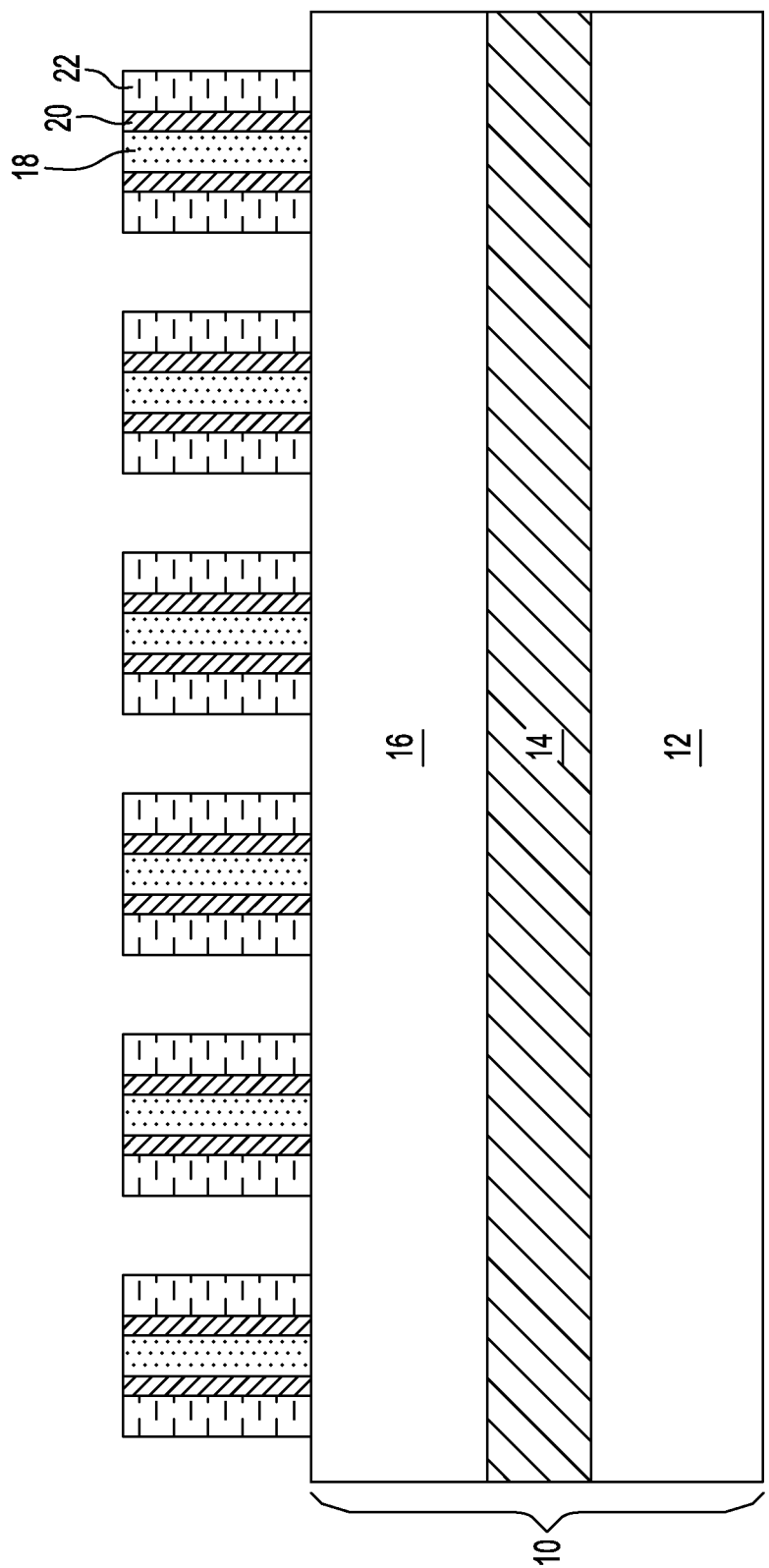
FIG. 4 is a cross-sectional view of the exemplary semiconductor structure of FIG. 3 after forming a sacrificial spacer on each sidewall of the first spacers.

Referring now to FIG. 4, there is illustrated the exemplary semiconductor structure of FIG. 3 after forming a sacrificial spacer 22 on each sidewall of the first spacers 20. The sacrificial spacers 22 that are employed in the present application may comprise a sacrificial spacer material that can be selectively removed with respect to materials of the first spacers 20 and the second spacer to be subsequently formed. The sacrificial spacer material can be the same or different from the material used for the mandrel structures 18. In one embodiment, the sacrificial spacers 22 include amorphous carbon.

The sacrificial spacers 22 can be formed by conformally depositing a sacrificial spacer material over the mandrel structures 18, the first spacers 20 and exposed surfaces of substrate 10 utilizing a conformal deposition process such as, for example, CVD, PECVD, or ALD. After depositing the sacrificial spacer material to provide a sacrificial spacer material layer (not shown), the sacrificial spacer material layer is anisotropically etched to remove horizontal portions of the sacrificial spacer layer. After removal of the horizontal portions of the sacrificial spacer material layer, the topmost surface of each mandrel structure 18 and each first spacer 20 is exposed and is coplanar with a topmost surface of each sacrificial spacer 22. The remaining vertical portions of the sacrificial spacer layer present on sidewalls of the first spacer 20 constitute the sacrificial spacers 22. A width of each sacrificial spacer 22 that is formed can be from 10 nm to 50 nm, although lesser and greater thicknesses can also be employed. In one embodiment and as shown in FIG. 4, each sacrificial spacer 22 has a width substantially the same as that of each mandrel structure 18. The term "substantially the same" as used herein in connection with the widths denotes that the width variations are within 10%. In another embodiment of the present application, each sacrificial spacer 22 may have a width different from that of each mandrel structure 18.

Figure 5:
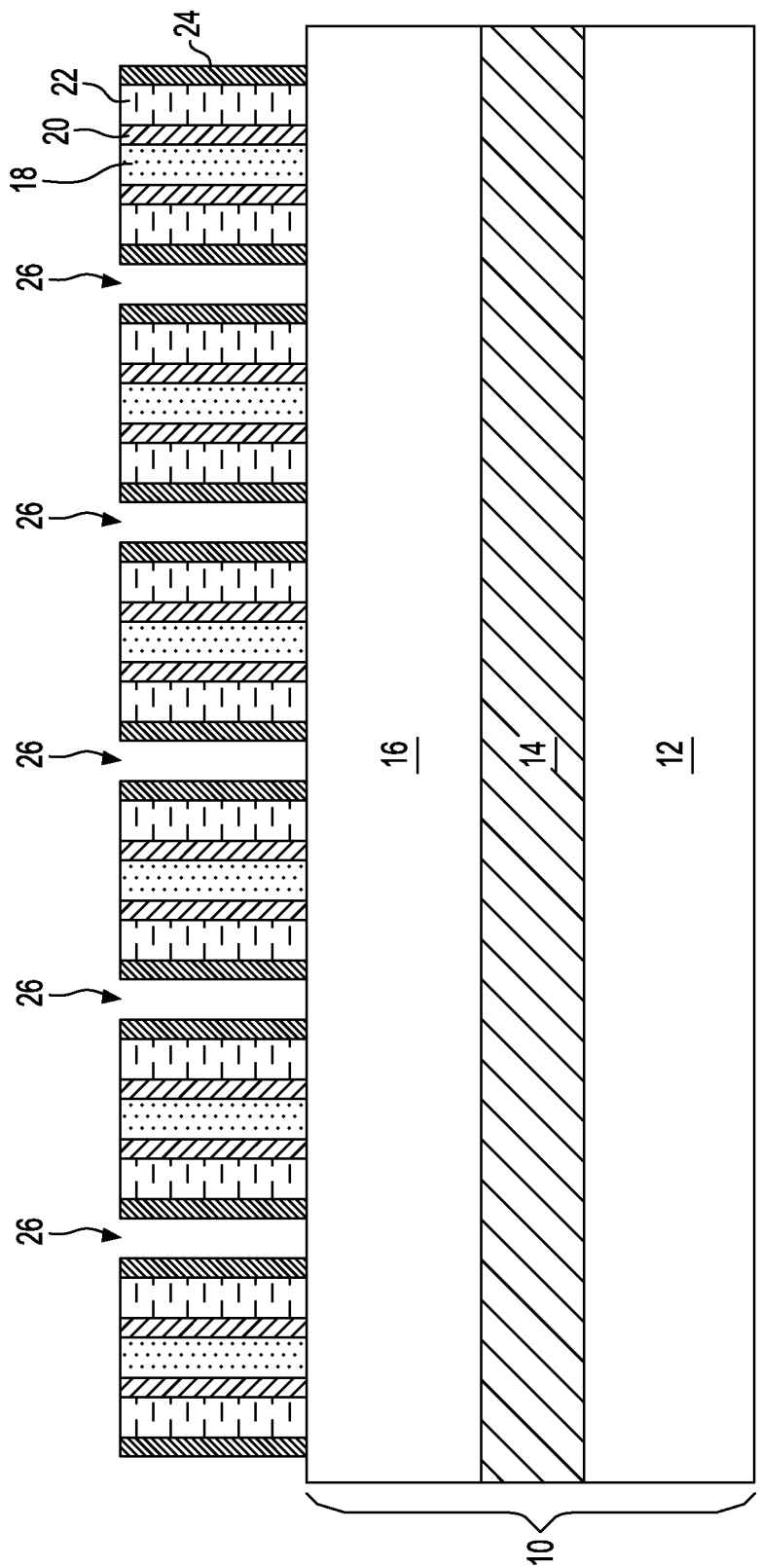
FIG. 5 is a cross-sectional view of the exemplary semiconductor structure of FIG. 4 after forming a second spacer on each sidewall of the sacrificial spacers.

Referring now to FIG. 5, there is illustrated the exemplary semiconductor structure of FIG. 4 after forming a second spacer 24 on each exposed sidewall surface of the sacrificial spacers 22. The second spacer 24 that is employed in the present application may comprise a dielectric material that is different from the materials of the first spacer 20 and sacrificial spacer 22, so that first spacer 20 and the sacrificial spacer 22 can be selectively removed with respect to the second spacer 24. In one embodiment and when the first spacer 20 is composes of silicon nitride and the sacrificial spacer 22 is composed of amorphous carbon, the second spacer 24 may be composed of a high k dielectric material, such as, for example, $HfO_2$.

The second spacer 24 can be formed by conformally depositing a second spacer material over the mandrel structures 18, the first spacer 20, the sacrificial spacer 22 and exposed surfaces of substrate 10 utilizing a conformal deposition process such as, for example, CVD, PECVD, or ALD to provide a second spacer material layer (not shown). As shown in FIG. 5, the thickness of the second spacer material layer is controlled such that the second spacer material layer does not entirely fill the spaces between adjacent sacrificial spacers 22. The thickness of the second spacer material layer that is formed can be from 5 to 10 nm, although lesser and greater thicknesses can also be employed.

Subsequently, horizontal portions of the second spacer material layer are removed utilizing an anisotropic etch forming the second spacers 24 on sidewalls of the sacrificial spacers 22. After removal of the horizontal portions of the second spacer material layer, the topmost surface of each mandrel structure 18, each first spacer 20 and each sacrificial spacer 22 is exposed and is coplanar with a topmost surface of each second spacer 24.

The width of each second spacer 24, as measured from its base, can be from 5 nm to 10 nm, although lesser and greater thicknesses can also be employed. In one embodiment and as shown in FIG. 5, each second spacer 24 has a width substantially the same as that of each first spacer 20. In another embodiment of the present application, each second spacer 24 may have a width different from that of each first spacer 20. In one embodiment, a uniform space 26 can be formed between each adjacent second spacers 24. In one embodiment, each space 26 has a width that is defined by the distance between each adjacent second spacers 24 the same as that of each mandrel structure 18 and each sacrificial spacer 22.

Figure 6:
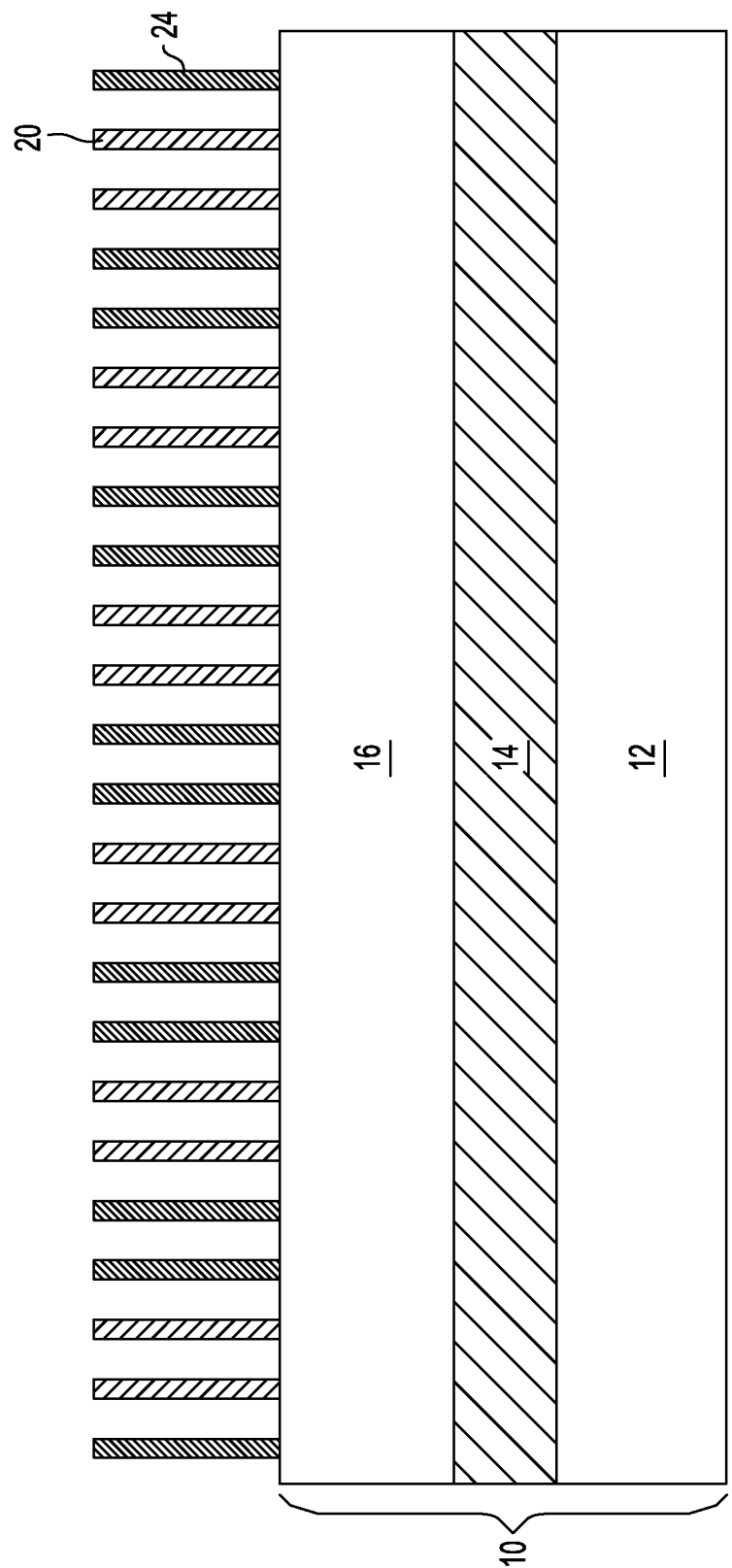
FIG. 6 is a cross-sectional view of the exemplary semiconductor structure of FIG. 5 after removing the mandrel structures and the sacrificial spacers.

Referring now to FIG. 6, there is illustrated the exemplary semiconductor structure of FIG. 5 after removing the mandrel structures 18 and the sacrificial spacers 22 from the structure. At least one etching process, either a wet etching or a dry etching, can be performed to remove each mandrel structure 18 and each sacrificial spacer 22 selective to each first spacer 20 and each second spacer 24. The at least one etching process can be an anisotropic or an isotropic etch. Removal of the mandrel structures 18 and the sacrificial spacers 22 provides a plurality of first spacers 20 and a plurality of second spacers 24 which are arranged in a way such that every adjacent pairs of the first spacers 20 are separated from each other by a pair of second spacers 24, and vice versa. In one embodiment and as shown in FIG. 6, each first spacer 20 has a width substantially the same as that of each second spacer 24, although they may be different from each other. Also shown in FIG. 6, the spacing between each adjacent first spacers 20, second spacers 24 and first and second spacers are substantially the same, although they may be different from each other.

Figure 7:
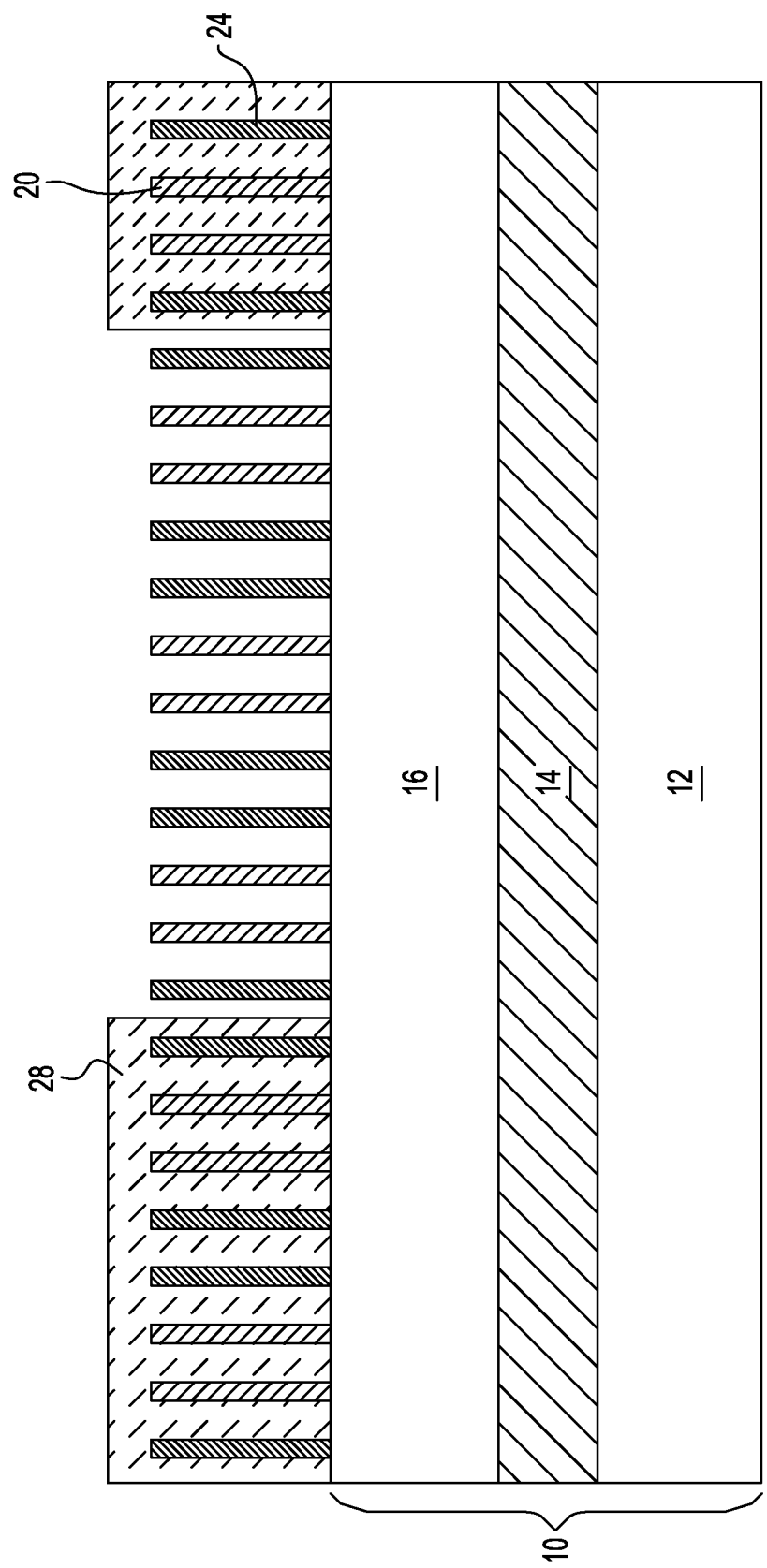
FIG. 7 is a cross-sectional view of the exemplary semiconductor structure of FIG. 6 after forming a first cut mask over the first spacers and second spacers.

Referring now to FIG. 7, there is illustrated the exemplary semiconductor structure of FIG. 6 after forming a first cut mask 28 over the first spacers 20 and second spacers 24. In one embodiment, the first cut mask 28 can be a photoresist layer that is lithographically patterned to form an opening that exposes unwanted pairs of first spacers 20. The opening also exposes second spacers 24 adjacent to or between the unwanted pairs of first spacers 20.

Figure 8:
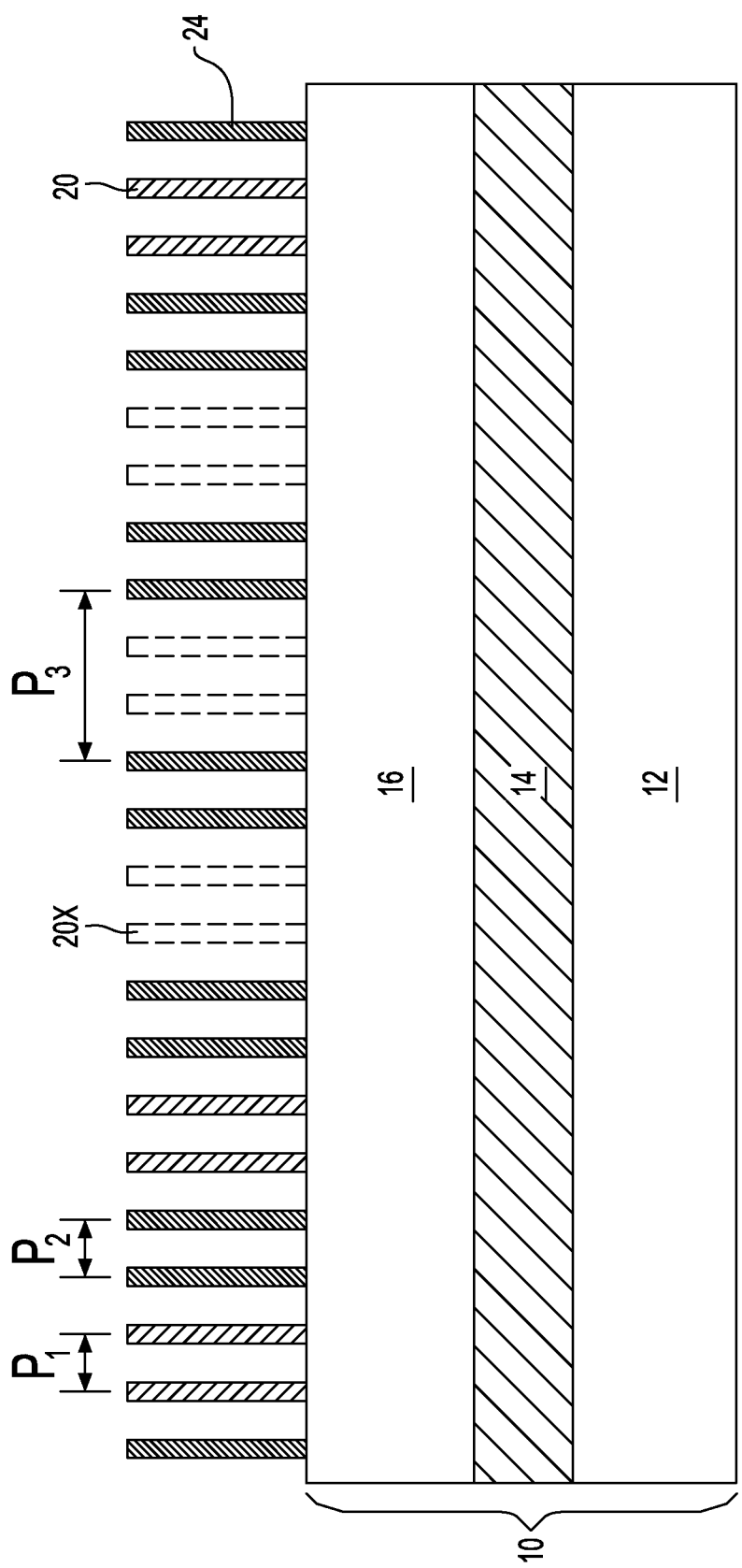
FIG. 8 is a cross-sectional view of the exemplary semiconductor structure of FIG. 7 after removing unwanted pairs of first spacers that are not covered by the first cut mask.

Referring now to FIG. 8, there is illustrated the exemplary semiconductor structure of FIG. 7 after removing the unwanted pairs of first spacers 20 that are not covered by the first cut mask 28. Physically exposed unwanted pairs of first spacers 20 may be removed by an anisotropic etch. The chemistry of the anisotropic etch is selected such that the material of the first spacers 20 is etched during the anisotropic etch, while the material of the second spacers 24 is not etched. A vacancy 20X is thus provided at a location from which each first spacer 20 is removed. Because the first and the second spacers 20, 24 of the present application are composed of two different materials possessing different etching characteristics, the etching process used to remove unwanted first spacers 20 will not adversely affect or cut the exposed second spacers 24. The second spacers 24 are left intact after the etching process. The cut mask overlay requirements are thus relaxed. This would allow fin cut at a very tight pitch.

In one embodiment and as shown in FIG. 8, when a width of each first spacer 20 is the same as that of each second spacer 24 and a spacing between each adjacent first spacers 20 is the same as that between each adjacent second spacers 24 and that between each adjacent first and second spacers 20, 24, after removing a pair of first spacers 20 that are located between adjacent pairs of second spacers 24, in the exposed region, the distance between center points of one second spacer 24 in one pair of second spacers 24 and an adjacent second spacer 24 in an adjacent pair of second spacers 24 (i.e., pitch $P_3$) is three times the distance between center points of each pair of first spacers 20 (i.e., pitch $P_1$) or the distance between center points of each pair of each pair of second spacers 24 (i.e., pitch $P_2$).

Subsequently, the first cut mask 28 is removed selective to the first and the second spacers 20, 24. In one embodiment and when the first cut mask 28 is a patterned photoresist layer, the first cut mask 28 can be removed by ashing.

Figure 9:
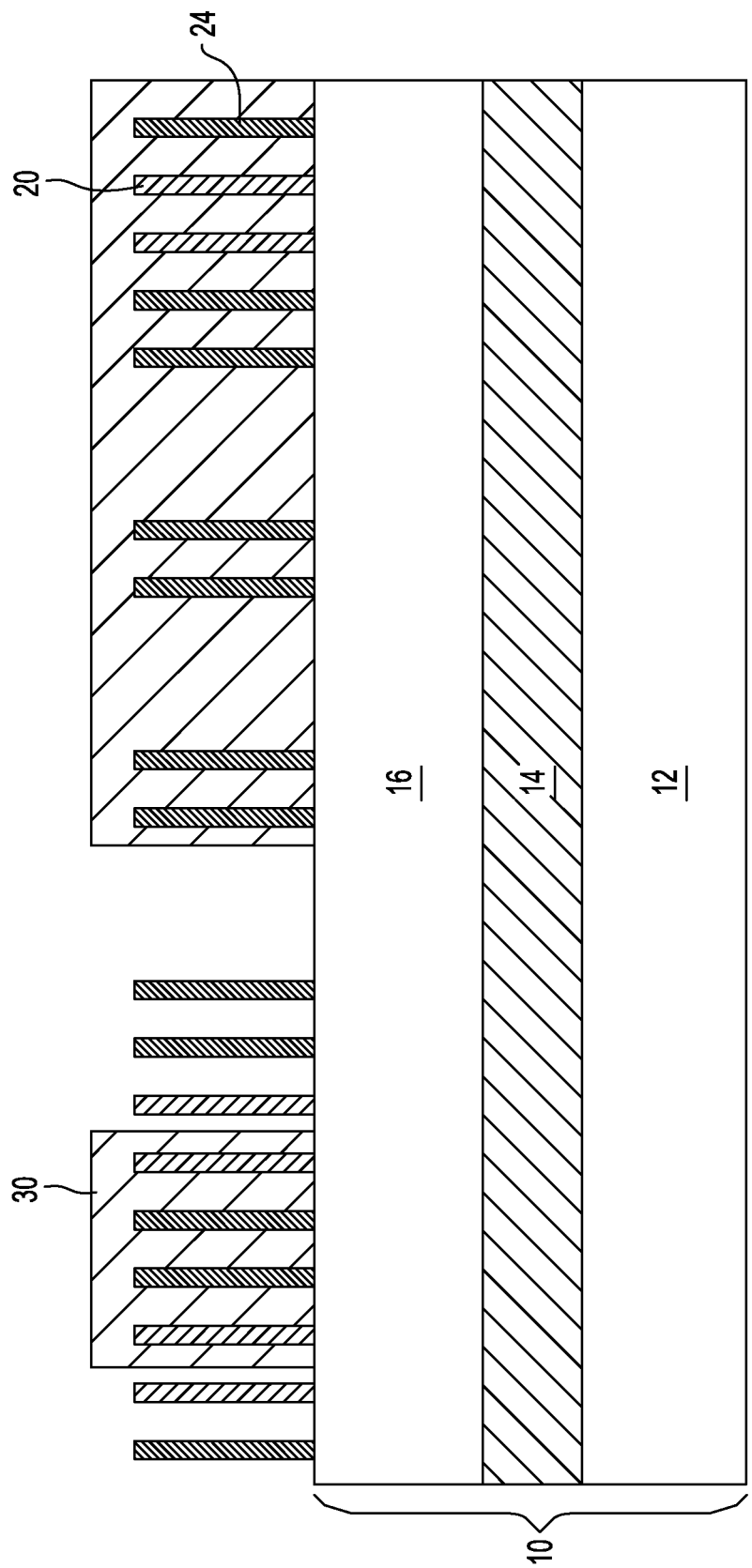
FIG. 9 is a cross-sectional view of the exemplary semiconductor structure of FIG. 8 after forming a second cut mask over remaining first spacers and second spacers.

Unwanted pairs of the second spacers 24 can also be removed by performing the processing steps described above with respect to the first spacers 20. Referring now to FIG. 9, there is illustrated the exemplary semiconductor structure of FIG. 8 after forming a second cut mask 30 over the first spacers 20 and second spacers 24. In one embodiment, the second cut mask 30 can be a photoresist layer that is lithographically patterned to form an opening that exposes an unwanted pair of second spacers 24. The opening also exposes first spacers 20 adjacent to the unwanted pair of second spacers 24.

Figure 10:
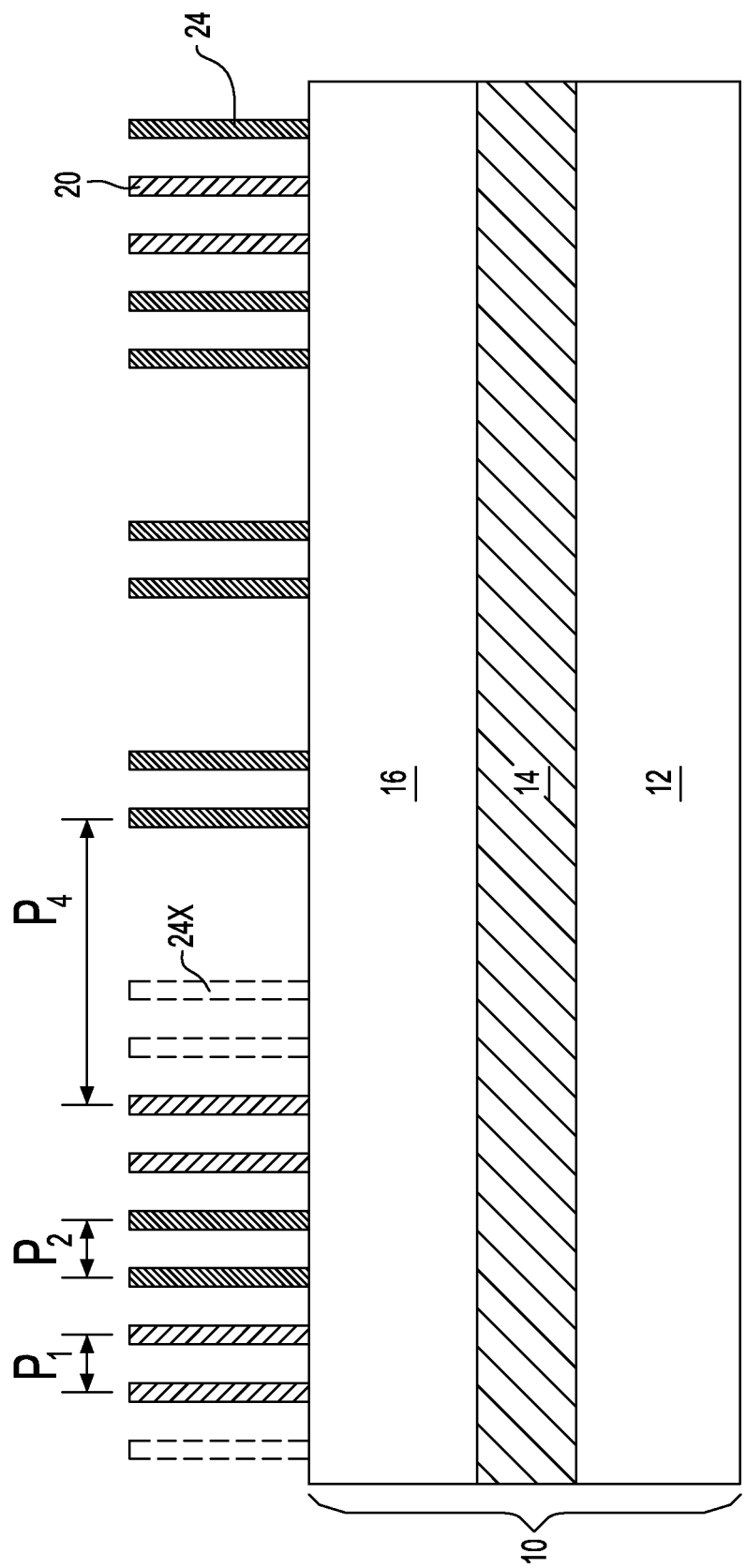
FIG. 10 is a cross-sectional view of the exemplary semiconductor structure of FIG. 9 after removing unwanted pairs of second spacers that are not covered by the second cut mask.

Referring now to FIG. 10, there is illustrated the exemplary semiconductor structure of FIG. 9 after removing the unwanted pair of second spacers 24 that are not covered by the second cut mask 30. Physically exposed unwanted pair of second spacers 24 may be removed by an anisotropic etch. The chemistry of the anisotropic etch is selected such that the material of the second spacers 24 is etched during the anisotropic etch, while the material of the first spacers 20 is not etched. A vacancy 24X is thus provided at a location from which each second spacer 24 is removed.

In one embodiment and as shown FIG. 10, after one pair of second spacers 24 is removed, the distance between center points of one first spacer 20 in one pair of the first spacers 20 and an adjacent second spacer 24 in an adjacent pair of second spacer (i.e., pitch $P_3$) is six times the first pitch.

Subsequently, the second cut mask 30 is removed selective to the first and the second spacers 20, 24. In one embodiment and when the second cut mask 28 is a patterned photoresist layer, the second patterned mask layer 28 can be removed by ashing.

Figure 11:
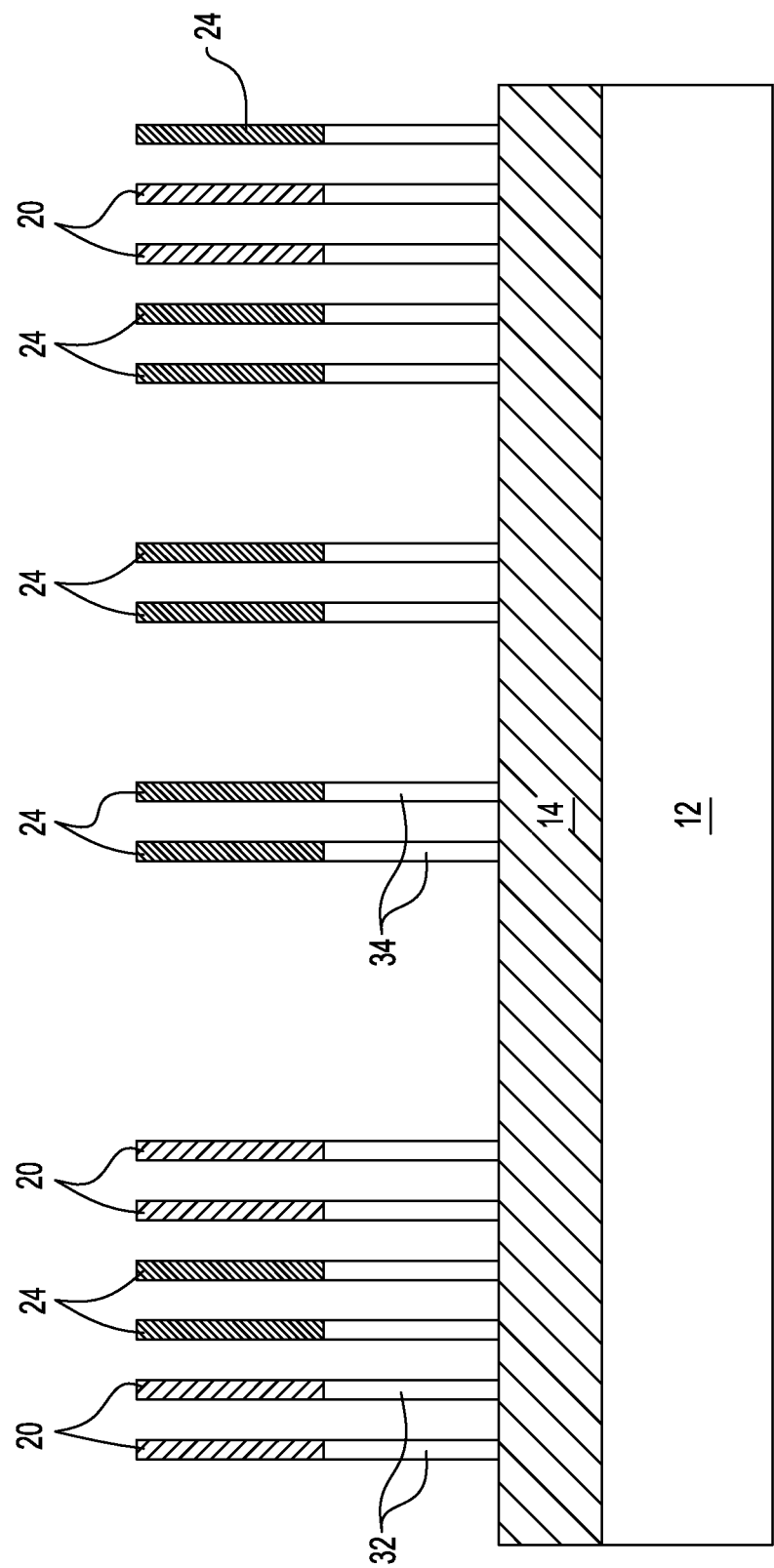
FIG. 11 is a cross-sectional view of the exemplary semiconductor structure of FIG. 10 after patterning the substrate using the remaining first spacers and the remaining second spacers as an etch mask.

Referring now to FIG. 11, there is illustrated the exemplary semiconductor structure of FIG. 10 after patterning the substrate 10 using remaining first spacers 20 and second spacers 24 as an etch mask. The patterning of the substrate 10 can be performed by utilizing an anisotropic etching process. In one embodiment of the present application and as is illustrated in FIG. 11, the patterning of the substrate 10 includes patterning of the topmost semiconductor layer 16 to provide a plurality of first semiconductor fins 32 having a width that is the same as the width of each first spacer 20 and a plurality of second semiconductor fin 34 having a width that is the same as the width of each second spacer 24. Each first semiconductor fin 32 and each second semiconductor fin 34 comprises a remaining portion of the topmost semiconductor layer 16.

As used herein, a "semiconductor fin" refers to a semiconductor structure including a portion having a shape of a rectangular parallelepiped. The direction along which a semiconductor fin laterally extends the most is herein referred to as a "lengthwise direction" of the semiconductor fin. The height of each first semiconductor fin 32 and each second semiconductor fin 34 can be in a range from 5 nm to 300 nm, although lesser and greater heights can also be employed. The width of each first semiconductor fin 32 and each second semiconductor fin can be in a range from 5 nm to 50 nm, although lesser and greater widths can also be employed. The width of each first semiconductor fin 32 can be the same or different than the width of each second semiconductor fin 34. Multiple first semiconductor fins 32 and multiple second semiconductor fins 34 may be arranged such that each semiconductor fin has the same lengthwise direction, and is laterally spaced from each other along a horizontal direction that is perpendicular to the lengthwise direction. In this case, the horizontal direction that is perpendicular to the common lengthwise direction is referred to as a "widthwise direction." Each semiconductor fin (32, 34) includes a pair of parallel sidewalls along the lengthwise direction and a pair of parallel sidewalls along the widthwise direction and at each end segment of the semiconductor fin (32, 34).

Figure 12:
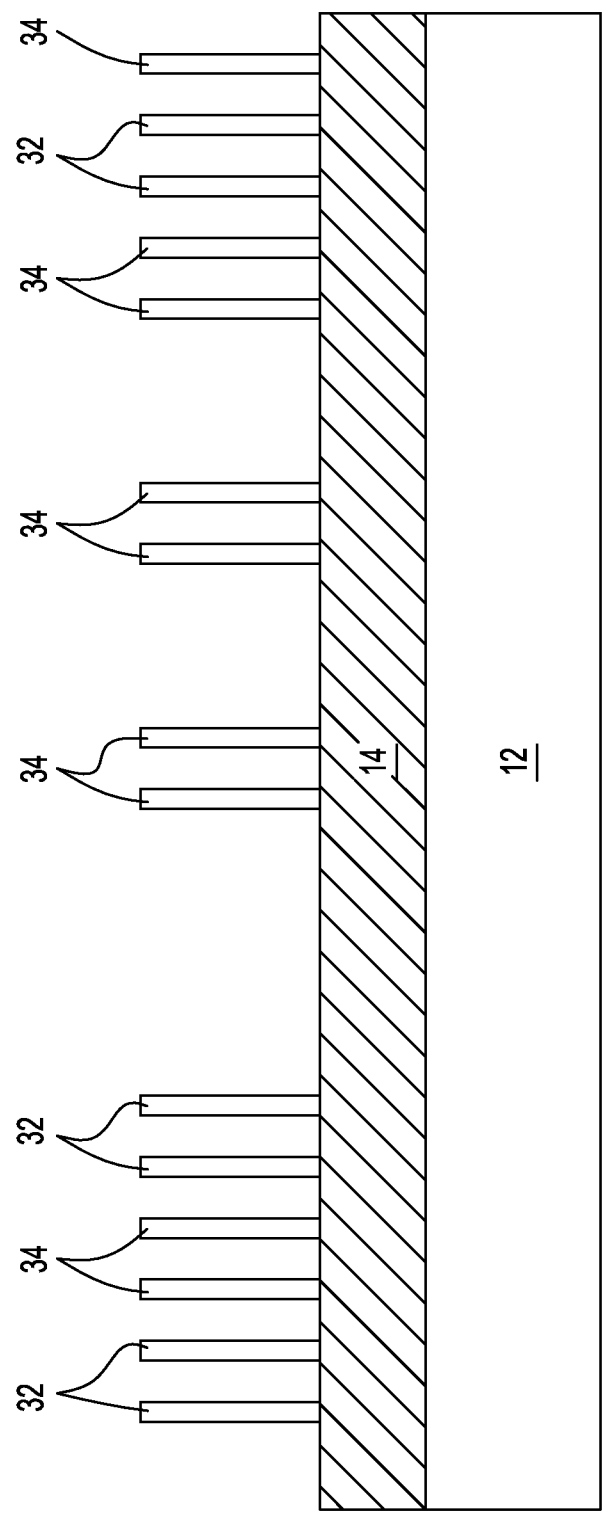
FIG. 12 is a cross-sectional view of the exemplary semiconductor structure of FIG. 11 after removing the remaining first spacers and the remaining second spacers.

Referring now to FIG. 12, there is illustrated the first exemplary semiconductor structure of FIG. 11 after removing the remaining first spacers 20 and second spacers 24. The remaining first and second spacers 20, 24 can be removed utilizing at least one etch which can be an anisotropic or an isotropic etch. Alternatively, the remaining pairs of the first and the second spacer 20, 24 can also be removed by a chemical mechanical planarization (CMP) process. The removal of the remaining first and second spacers 20, 24 exposes topmost surfaces of the first semiconductor fins 32 and the second semiconductor fins 34.

At this point of the present application, a functional gate structure utilizing a gate first or a gate last process can be performed to provide FinFET structures. It is noted that while the above describes a method of forming semiconductor fins from a semiconductor substrate, the method of the present application can be applied to pattern any other type substrate.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   forming a plurality of mandrel structures on a substrate;
   forming first spacers on sidewalls of the plurality of mandrel structures;
   forming sacrificial spacers on sidewalls of the first spacers;
   forming second spacers on sidewalls of the sacrificial spacers;
   removing the plurality of mandrel structures and the sacrificial spacers selective to the first spacers and the second spacers;
   forming a cut mask including at least one opening therein over the first spacers, the second spacers and exposed surfaces of the substrate, the at least one opening exposing portions of the first spacers and portions of the second spacers;
   removing exposed portions of the first spacers selective to exposed portions of the second spacers;
   removing the cut mask selective to remaining portions of the first spacers and the second spacers;
   forming another cut mask including at least one opening therein over the remaining portions of the first spacers, the second spacers and exposed surfaces of the substrate, the at least one opening exposing portions of the remaining portions of the first spacers and portions of second spacers; and
   removing exposed portions of the second spacers selective to exposed portions of the remaining portions of the first spacers.

2. The method of claim 1, wherein the removing the plurality of mandrel structures and sacrificial spacers provides a plurality of first spacers and a plurality of second spacers, wherein every adjacent pairs of the first spacers are separated from each other by a corresponding pair of the second spacers.

3. The method of claim 1, wherein each of the second spacers comprises a material different from a material of each of the first spacers.

4. The method of claim 3, wherein each of the first spacers comprises a dielectric nitride, and wherein each of the second spacers comprises a high k dielectric material.

5. The method of claim 1, wherein the removing the exposed portions of the first spacers comprises removing at least one pair of the first spacers located between adjacent pairs of the second spacers.

6. The method of claim 1, wherein the removing the exposed portions of the second spacers comprises removing at least one pair of the second spacers located between adjacent pairs of the first spacers.

7. The method of claim 1, further comprising patterning a portion of the substrate utilizing the remaining portions of the first spacers and remaining portions of the second spacers as an etch mask.

8. The method of claim 7, further comprising removing the remaining portions of the first spacers and the remaining portions of the second spacers after the patterning the portion of the substrate.

9. The method of claim 8, wherein the portion of the substrate comprises a semiconductor material.

10. The method of claim 1, wherein the forming the plurality of mandrel structures comprises:
    depositing a mandrel material layer on an entire topmost surface of the substrate; and
    patterning the mandrel material layer by lithography and etching.

11. The method of claim 1, wherein the forming the first spacers on sidewalls of the plurality of mandrel structures comprises:
    forming a first spacer material layer over the plurality of mandrel structures and exposed surfaces of the substrate; and
    removing horizontal portions of the first spacer material layer by an anisotropic etch.

12. The method of claim 1, wherein the forming the sacrificial spacers on sidewalls of the first spacers comprises:
    forming a sacrificial spacer material layer over the plurality of mandrel structures, the first spacers and exposed surfaces of the substrate; and
    removing horizontal portions of the sacrificial spacer material layer by an anisotropic etch.

13. The method of claim 1, wherein the forming the second spacers on sidewalls of the sacrificial spacers comprises:
    forming a second spacer material layer over the plurality of mandrel structures, the first spacers, the sacrificial spacers and exposed surfaces of the substrate; and
    removing horizontal portions of the second spacer material layer by an anisotropic etch.

14. The method of claim 1, wherein each of the plurality of mandrel structures comprises amorphous silicon, and wherein each of the sacrificial spacers comprises amorphous carbon.

15. The method of claim 1, wherein the first spacers and the second spacers have a substantially same width, and the plurality of the mandrel structure and the sacrificial spacers have a substantially same width.

* * * * *